(12) United States Patent
Madisetti et al.

(10) Patent No.: US 7,808,408 B2
(45) Date of Patent: Oct. 5, 2010

(54) MINIMIZING ADVERSE EFFECTS OF SKEW BETWEEN TWO ANALOG-TO-DIGITAL CONVERTERS

(75) Inventors: Avanindra Madisetti, Coto de Caza, CA (US); Thomas D. Kwon, Irvine, CA (US); Aaron W. Buchwald, Newport Coast, CA (US)

(73) Assignee: Moblus Semiconductor, Inc., Irvine, CA (US)

( * ) Notice: Subject to any disclaimer, the term of this patent is extended or adjusted under 35 U.S.C. 154(b) by 23 days.

(21) Appl. No.: 12/388,627

(22) Filed: Feb. 19, 2009

(65) Prior Publication Data

US 2010/0060496 A1 Mar. 11, 2010

Related U.S. Application Data

(60) Provisional application No. 61/095,006, filed on Sep. 8, 2008.

(51) Int. Cl.
*H03M 1/06* (2006.01)

(52) U.S. Cl. ...................................... 341/118; 341/155
(58) Field of Classification Search ................. 341/118, 341/155
See application file for complete search history.

(56) References Cited

U.S. PATENT DOCUMENTS

| 6,452,518 B1 * | 9/2002 | Kawabata | 341/118 |
| 6,836,227 B2 * | 12/2004 | Asami | 341/118 |
| 7,084,793 B2 * | 8/2006 | Elbornsson | 341/118 |
| 7,283,074 B2 * | 10/2007 | Sheng et al. | 341/120 |
| 7,675,441 B2 * | 3/2010 | Sheng et al. | 341/120 |

* cited by examiner

*Primary Examiner*—Khai M Nguyen

(57) ABSTRACT

Skew between a first clock signal received by a first analog-to-digital converter (ADC) and a second clock signal received by a second ADC is adjusted to minimize error. Each ADC has an ADC element that produces a respective first or second digital output signal in response to an analog input signal and a respective first or second clock signal. A correction signal is produced in response to the first and second digital output signals. The skew between the first and second clock signals is then adjusted in response to the correction signal.

11 Claims, 5 Drawing Sheets

MINIMIZING ADVERSE EFFECTS OF SKEW BETWEEN TWO ANALOG-TO-DIGITAL CONVERTERS

CROSS-REFERENCE TO RELATED APPLICATION

The benefit of the filing date of U.S. Provisional Patent Application No. 61/095,006, filed Sep. 8, 2008, entitled "A METHOD TO ESTIMATE THE SKEWS BETWEEN TWO ADCS," is hereby claimed, and the specification thereof incorporated herein in its entirety by this reference.

BACKGROUND

An analog-to-digital converter (ADC) is an electronic device that receives an analog signal as an input and produces a digital representation of that signal as an output, i.e., it converts the analog signal to a digital signal. An ADC typically comprises an input buffer, a sample-and-hold or similar circuit, and an ADC element. The sample-and-hold circuit holds a sample of the analog signal for a time interval sufficient to allow the ADC element to perform the conversion process on the sample. The sample-and-hold circuit typically includes a clock input and associated switching circuitry, such as one or more transistors, to enable converting successive samples in a clocked manner.

In some ADC applications, it is desirable for two or more ADCs to operate in parallel with each other. That is, each of the ADCs in the system receives the same analog signal as the others and produces a digital representation of that signal. In theory, in such a system the digital value at the output of each ADC at any given instant in time will be the same as the digital value at the output of every other ADC. However, in actual circuit implementations clock skews can cause ADC outputs to differ from one another.

For example, as illustrated in FIG. 1, a first ADC 10 and a second ADC 12 receive as inputs the same analog signal ("ANALOG IN") and clock signal ("CLOCK IN"). A first buffer 14 in first ADC 10 receives the analog signal. A second buffer 16 in second ADC 12 similarly receives the analog signal. When the clock signal transitions from a low state to a high state, it turns on a first transistor 18 in first ADC 10 and a second transistor 20 in ADC 12. Transistors 18 and 20 function as switches. When first transistor 18 is turned on, a sample-and-hold element 22 in ADC 10 receives and stores a sample of the analog signal at the output of first buffer 14. Likewise, when second transistor 20 is turned on, a sample-and-hold element 24 in ADC 12 receives and stores a sample of the analog signal at the output of second buffer 16. A first ADC element 26 in first ADC 10 performs an analog-to-digital conversion on the sample stored in sample-and-hold element 22 and outputs a first digital signal ("DIGITAL OUT1"). A second ADC element 28 in second ADC 12 similarly performs an analog-to-digital conversion on the sample stored in sample-and-hold element 24 and outputs a second digital signal ("DIGITAL OUT2"). However, the first and second digital signals may not be precisely the same value, due to clock skew or input signal skew. Skew can exist between the clock signal that reaches first transistor 18 in ADC 10 and the clock signal that reaches second transistor 18 in ADC 12. Similarly, skew can exist between the analog signal that reaches the input of first buffer 14 in ADC 10 and the analog signal that reaches the input of second buffer 16 in ADC 12. Such skews are mainly caused by differences in the lengths of the circuit traces that carry the signals, which correspondingly delay the respective signals by different amounts of time.

In some high-speed ADCs, multiple ADC elements are interleaved to increase the sampling rate of the conversion. Such an ADC may include additional inputs that allow DC offset, gain and clock timing of each ADC element to be adjusted so that the ADC elements operate uniformly.

It would be desirable to minimize the adverse effect of the skews so that both of the ADCs produce the same digital output value on a given clock cycle.

SUMMARY

Embodiments of the invention relate to a system and method in which a skew between a first clock signal received by a first analog-to-digital converter (ADC) and a second clock signal received by a second ADC is adjusted to minimize error. The first ADC includes a first ADC element that operates upon a first analog signal representing a sample of a signal to be converted. Similarly, the second ADC includes a second ADC element that operates upon a second analog signal representing a sample of the signal to be converted. The first ADC element produces a first digital output signal in response to first analog signal and a first clock signal representing a master clock signal. The second ADC element produces a second digital output signal in response to second analog signal and a second clock signal representing the master clock signal. A correction signal is produced in response to the first digital output signal and the second digital output signal. The skew between the first clock signal and the second clock signal is then adjusted in response to the correction signal.

Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The components within the figures are not necessarily to scale, emphasis instead being placed upon clearly illustrating the principles of the invention. Moreover, in the figures, like reference numerals designate corresponding parts throughout the different views.

DETAILED DESCRIPTION

Figure 2:
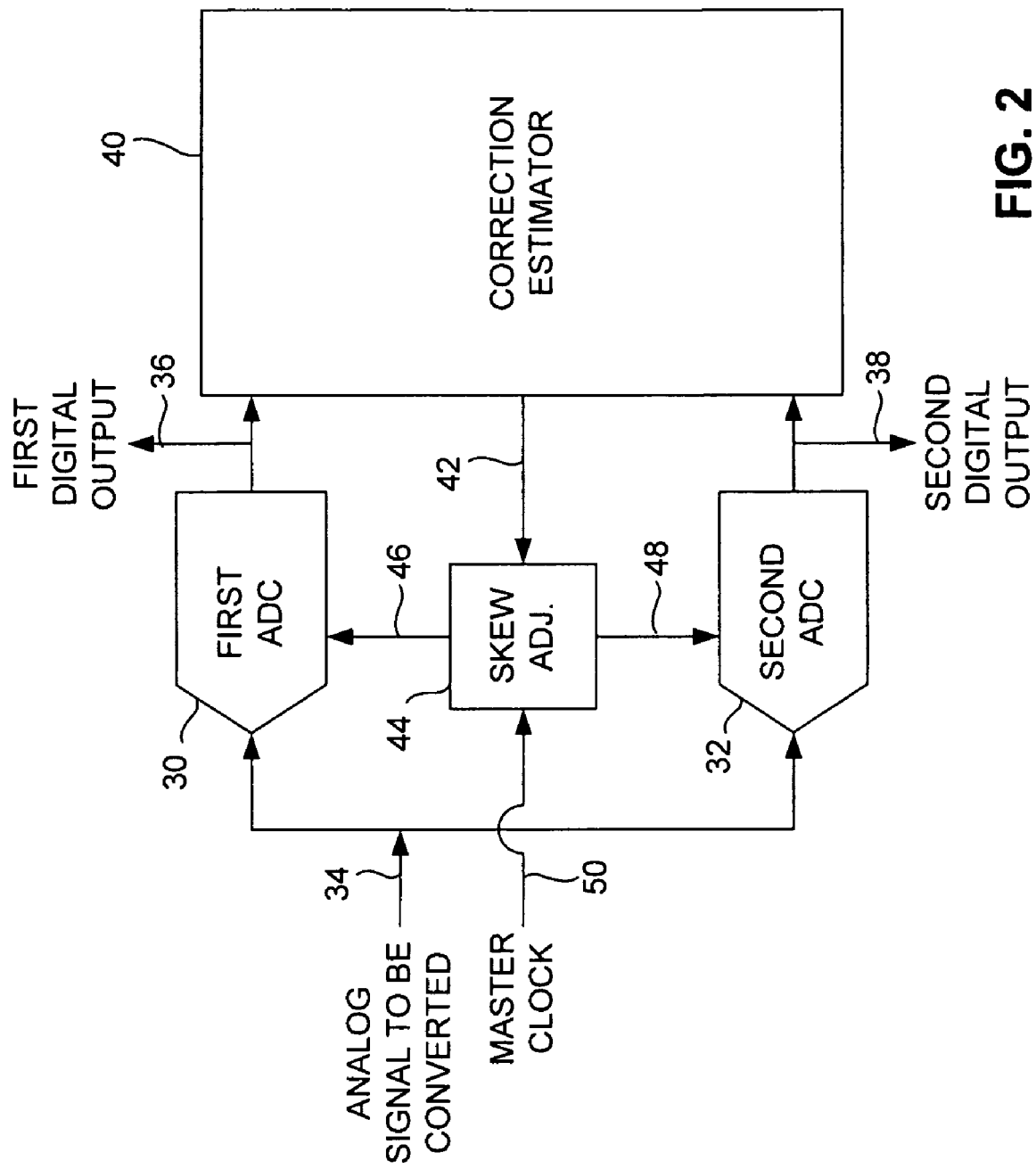
FIG. 2 is a simplified block diagram of a system for minimizing adverse effects of skew between two ADCs, in accordance with an exemplary embodiment of the invention.

As illustrated in FIG. 2, in accordance with an exemplary embodiment of the invention, a first analog-to-digital converter (ADC) 30 and a second ADC 32 are arranged to operate in parallel. That is, both ADC 30 and ADC 32 operate to convert the same analog signal 34 to respective first and second digital output signals 36 and 38. As described below in further detail, a correction estimator 40 produces a correction signal 42 in response to first and second digital output signals 36 and 38. It should be understood that a reference to producing an output signal "in response to" an input signal, as used in this patent specification ("herein"), means that the input signal, or one or more signals derived from the input signal as a result of processing by a system of one or more elements, is used as an input to a system of one or more elements that, as a result of using the input signal and zero or more other signals as inputs to the process, produces the output signal. Also, the term "coupled" as used herein means connected via zero or more intermediate elements.

A timing or skew adjuster 44 adjusts the skew between a first clock signal 46 and a second clock signal 48 in response to correction signal 42. Skew adjuster 44 can include any suitable element or elements that adjust one or both of first and second clock signals 46 and 48 with respect to one another so that the relative timing, i.e., skew, between first and second clock signals 46 and 48 is adjusted. Skew adjuster 44 produces first and second clock signals 46 and 48 in response to a master clock signal 50 such that each of first and second clock signals 46 and 48 has the same period, duty cycle and other such clock characteristics as master clock signal 50. First and second ADCs 30 and 32 operate, i.e., perform the analog-to-digital conversion process, in response to first and second clock signals 46 and 48, respectively, in the manner described in further detail below.

Figure 1:
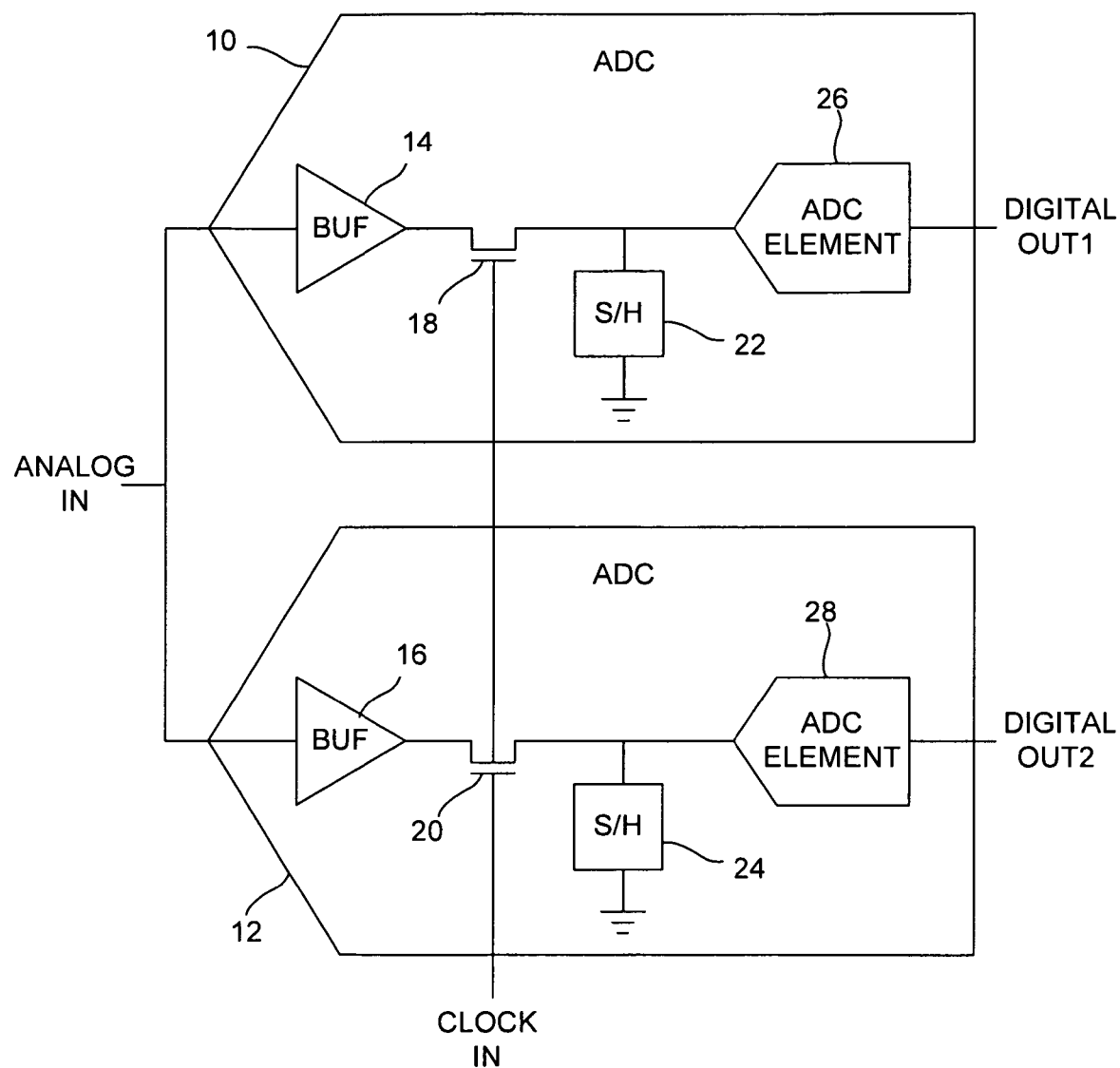
FIG. 1 is a block diagram of two analog-to-digital converters (ADCs) operating in parallel, as known in the prior art.
Figure 3:
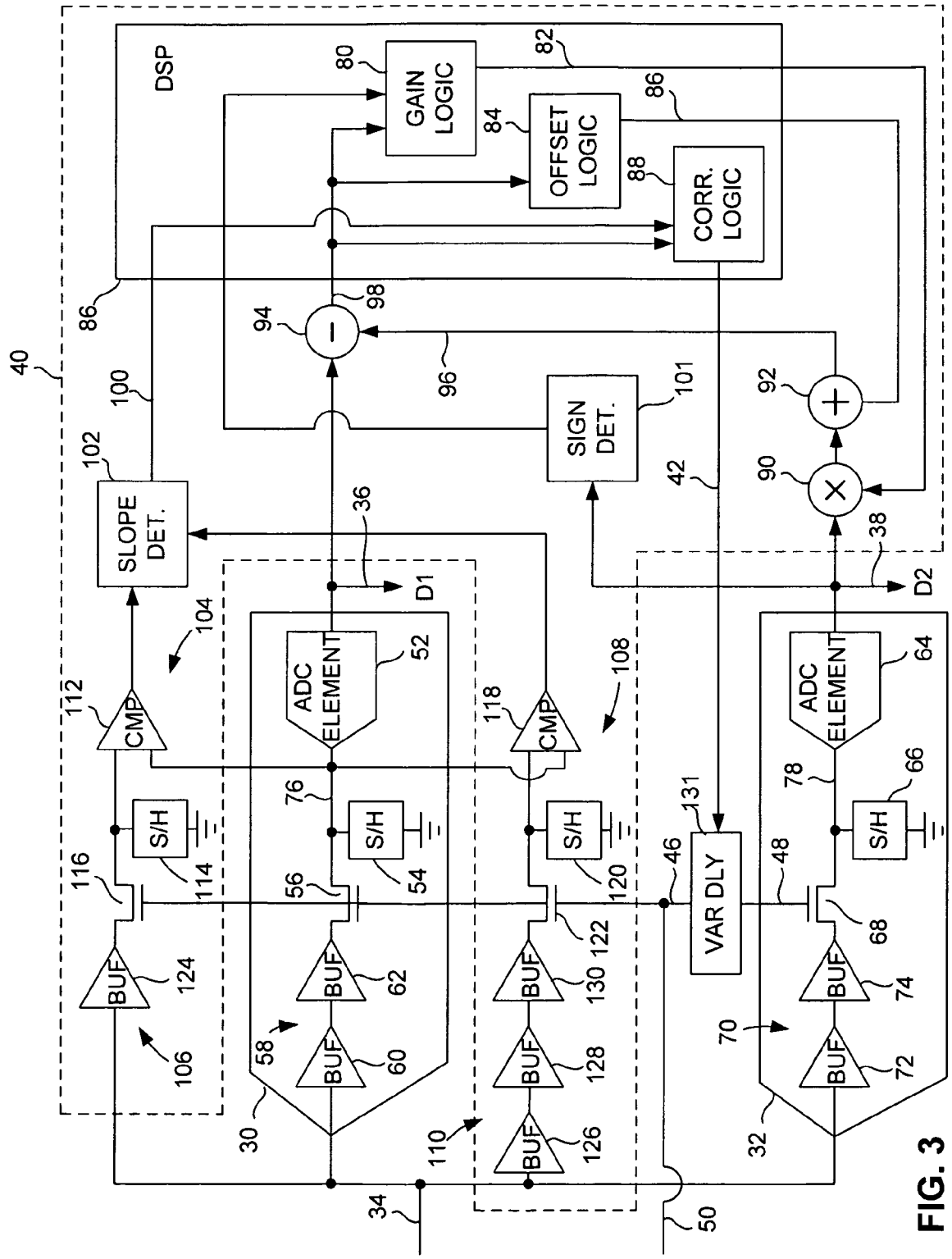
FIG. 3 is a block diagram of the system of FIG. 2, showing the system in further detail.

As illustrated in further detail in FIG. 3, ADC 30 includes a first ADC element 52, a first sample-and-hold element 54, a first transistor 56, and a buffer system 58 that comprises two buffers 60 and 62. For reasons described below with regard to this exemplary embodiment, buffer system 58 provides a predetermined time delay, the length of which corresponds to the number (two, in this instance) of delay elements or buffers 60 and 62. Similarly, ADC 32 includes a second ADC element 64, a second sample-and-hold element 66, a second transistor 68, and a buffer system 70 that comprises two buffers 72 and 74. Buffer system 70 similarly provides a predetermined delay corresponding to the two delay elements or buffers 72 and 74. As ADCs 30 and 32 operate in the same manner as described above with regard to ADCs 10 and 12 in FIG. 1, a description of such operation is not repeated here.

First ADC element 52 produces first digital output signal 36 in response to a first analog signal 76. Note that first analog signal 76 is a sample of analog signal 34, delayed by buffer system 58, and provided to ADC element 52 via transistor 56 and sample-and-hold element 54. Transistor 56 is turned on and off in response to first clock signal 46.

Second ADC element 64 produces second digital output signal 38 in response to a second analog signal 78. Note that second analog signal 78 is a sample of analog signal 34, delayed by buffer system 70, and provided to ADC element 64 via transistor 68 and sample-and-hold element 66. Transistor 68 is turned on and off in response to second clock signal 48.

Correction estimator 40 includes gain logic 80 that produces a gain signal 82, offset logic 84 that produces an offset signal 86, and correction logic 88 that produces correction signal 42. At least some of the elements of correction estimator 40, such as gain logic 80, offset logic 84, and correction logic 88, can be embodied, for example, in a digital signal processor (DSP) 86 or similar processing device or system. As well understood in the art, a DSP is an integrated circuit chip that includes a processor or similar logic, memory, and associated elements that allow the system to operate in accordance with programming or configuration instructions. As the operation and programming of a DSP is well understood in the art, such aspects are not described herein. In view of the descriptions herein, persons skilled in the art will be readily capable of programming or configuring a DSP or similar device to operate as shown and described herein. Specifically, gain logic 80, offset logic 84, and correction logic 88 are described in further detail below.

Correction estimator 40 further includes a multiplier 90, an adder 92, and a subtractor 94. Multiplier 90 multiplies second digital output signal 38 by gain signal 82. The combination of multiplier 90 and adder 92 can be termed a skew estimator for purposes of convenience of reference. Adder 92 adds offset signal 86 to the output of multiplier 90 to form a skew estimate signal 96. Thus, in the exemplary embodiment, the skew estimator produces skew estimate signal 96 in response to second digital output signal 38, gain signal 82 and offset signal 86. Subtractor 94 determines the difference between first digital output signal 36 and skew estimate signal 96, i.e., it subtracts one from the other. This difference is represented by an error signal 98 that is provided by subtractor 94.

Correction estimator 40 further includes a slope detector that produces a slope factor 100 indicating whether first analog signal 76 is monotonically increasing (i.e., rising), monotonically decreasing (i.e., falling), or neither at approximately the time at which ADC element 52 receives it for conversion. The slope detector is defined by slope detector logic 102, a first comparator system portion 104, a corresponding buffer system 106, a second comparator system portion 108, and a similarly corresponding buffer system 110. First comparator system portion 104 includes a comparator 112, a sample-and-hold element 114, and a transistor 116. Second comparator system portion 108 similarly includes a comparator 118, a sample-and-hold element 120, and a transistor 122. First and second comparator systems 104 and 108 function in the same manner as described above with regard to similar structures shown in FIG. 1.

Buffer system 106 provides a predetermined time delay, the length of which corresponds to the number of delay elements or buffers. Buffer 124 of buffer system 106 defines one such delay element. Similarly, buffer system 110 provides a predetermined time delay, the length of which corresponds to the number of delay elements or buffers. Buffers 126, 128 and 130 define three such delay elements.

The slope detector determines slope factor 100 in response to a sample of first analog signal 76 taken before conversion by ADC element 52 and another sample of first analog signal 76 taken after conversion by ADC element 52. One input of each of comparators 112 and 118 receives first analog signal 76. Note that first analog signal 76 is delayed by two delay elements (i.e., buffers 60 and 62) by the time it is received at these inputs of comparators 112 and 118. The other input of comparator 112 receives a signal that, like first analog signal 76, is representative of analog signal 34, but is delayed by only one delay element (i.e., buffer 124) by the time it is received at this other input of comparator 112. Correspondingly, the other input of comparator 118 receives a signal that, like first analog signal 76, is representative of analog signal 34, but is delayed by three delay elements (i.e., buffers 126, 128 and 130) by the time it is received at this other input of comparator 118. In this exemplary embodiment, each of buffers 60, 62, 72, 74, 124, 126, 128 and 130 provides the same time delay (which can be referred to for convenience as a delay unit) as all others of those buffers. Thus, comparator 112 compares a sample of first analog signal 76 with a similar sample taken one delay unit earlier, while comparator 118 compares a sample of first analog signal 76 with a similar sample taken one delay unit later. Slope detector logic 102 uses the outputs of comparators 112 and 118 to determine whether first analog signal 76 is rising (i.e., monotonically increasing) at the time of conversion by first ADC element 52, falling (i.e., monotonically decreasing) at the time of conversion by first ADC element 52, or neither. Note that first analog signal 76 can be neither rising nor falling if the sample occurs on or near a cusp of its waveform, with the "early" sample evaluated by comparator 112 occurring, for example, before the cusp, and the "late" sample evaluated by comparator 118 occurring after the cusp.

In the exemplary embodiment, slope detector logic 102 can produce a "1" as slope factor 100 if the "late sample" is greater than first analog signal 76, and first analog signal 76 is greater than the "early sample," thereby indicating that first analog signal 76 is rising. Slope detector logic 102 can produce a "−1" as slope factor 100 if the "late sample" is less than first analog signal 76, and first analog signal 76 is less than the "early sample," thereby indicating that first analog signal 76 is falling. Slope detector logic 102 can produce a "0" as slope factor 100 to indicate that first analog signal 76 occurs on a cusp and is thus neither rising nor falling monotonically at the time of conversion by first ADC element 52.

Correction logic 88 receives error signal 98 and slope factor 100. Offset logic 84 receives error signal 98. Gain logic 80 receives error signal 98 and a value representing the sign (i.e., positive or negative) of the value sampled by ADC 64, as determined by a sign detector 101. Although not shown in FIG. 3 for purposes of clarity, gain logic 80, offset logic 84, and correction logic 88 are coordinated with master clock 50 (i.e., either synchronized with master clock 50 itself or a clock that is synchronized or otherwise coordinated with master clock 50), such that on each clock cycle, gain logic 80, offset logic 84, and correction logic 88 can produce new output values that replace previous or old output values. If slope factor 100 indicates that first analog signal 76 is either rising or falling, then gain logic 80, offset logic 84, and correction logic 88 each produces a new output value. If slope factor 100 indicates that first analog signal 76 is neither rising nor falling, then each of gain logic 80, offset logic 84, and correction logic 88 maintains its then-current output value.

Gain logic 80 can produce a new gain signal 82 in accordance with the following equation:

$$G(t)=G(t-1)+\mu*e*\text{sign}(D_2),$$

where "G(t)" represents a new value of gain signal 82, "G(t−1)" represents the previous or then-current value of gain signal 82, "μ" represents a predetermined step size, "e" represents error signal 98, and "sign(D$_2$)" represents the sign of the sampled value of ADC 64.

Offset logic 84 can produce a new offset signal 86 in accordance with the following equation:

$$O(t)=O(t-1)+\mu*e,$$

where "O(t)" represents a new value of offset signal 86, "O(t−1)" represents the previous or then-current value of offset signal 86, "μ" represents a predetermined step size, "e" represents error signal 98.

Correction logic 88 can produce a new correction signal 42 in accordance with the following equation:

$$\tau(t)=\tau(t-1)+\mu*e*\text{slope},$$

where "τ(t)" represents a new value of correction signal 42, "τ(t−1)" represents the previous or then-current value of correction signal 42, "μ" represents a predetermined step size, "e" represents error signal 98, and "slope" represents slope factor 100.

In the exemplary embodiment, skew adjuster 44 (FIG. 2) can more specifically be a variable delay element 131 that delays second clock signal 48 with respect to first clock signal 46. Alternatively, skew adjuster 44 can be anything that provides an adjustable relative skew or offset between first and second clock signals 46 and 48.

Figure 4:
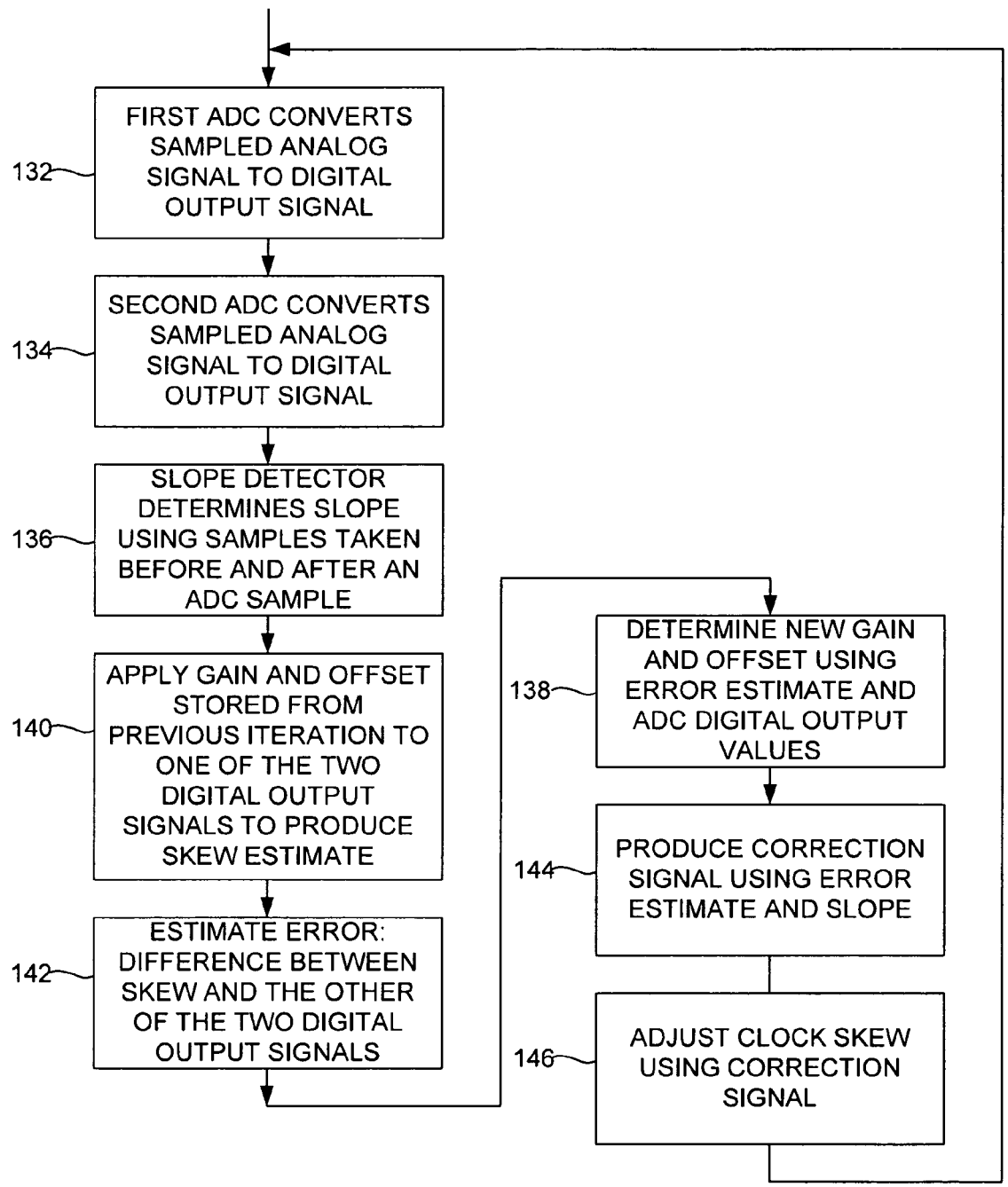
FIG. 4 is a flow diagram, illustrating an exemplary method of operation of the system of FIGS. 2-3.

The method by which the above-described system operates is illustrated by the flow diagram of FIG. 4. The method can begin at any suitable time, such as when the system is powered on. It should be understood that the system shown in FIGS. 2-3 can be part of a more encompassing, overall system, such as an interleaved ADC (not shown) having an array of individual ADCs in which ADCs 30 and 32 can be included. Accordingly, although not described herein for purposes of clarity, operation of the system shown in FIGS. 2-3 can be coordinated with the operation of other elements of an interleaved ADC or other overall system.

As indicated by block 132, first ADC 30 converts analog signal 34 to first digital output signal 36. As indicated by block 134, second ADC 32 similarly converts analog signal 34 to second digital output signal 38. As indicated by block 136, the slope detector, which is defined by the combination of slope detector logic 102, comparator systems 104 and 108, and delay systems 106 and 110, determines the slope of analog signal sample 76, i.e., rising or falling, in response to signal samples taken earlier and later than analog signal (sample) 76.

As indicated by block 140, a skew estimator defined by the combination of multiplier 90 and adder 92 produces skew estimate signal 96 in response to second digital output signal 38, gain signal 82 as determined on a previous iteration, and offset signal 86 as determined on a previous iteration. As indicated by block 142, subtractor 94 produces error signal 98 by determining the difference between first digital output signal 36 and skew estimate signal 96. Although in the exemplary embodiment the skew estimator is coupled to the output of second ADC 32, and subtractor 94 is coupled to the output of first ADC 32, it should be noted that in other embodiments the skew estimator can be coupled to either of the two ADCs, and that the subtractor can likewise be coupled to either of the ADCs, as described in further detail below.

As indicated by block 138, gain logic 80 and offset logic 84 produce gain and offset signals 82 and 86, respectively, in response to error signal 98 and a sampled ADC output value obtained on a previous iteration. Gain and offset signals 82 and 86 are stored for use in the next iteration (described above with regard to block 140).

As indicated by block 144, correction logic 88 produces correction signal 42 in response to error signal 98 and slope factor 100. Variable delay element 131 delays second clock signal 48 with respect to first clock signal 46 in response to correction signal 42, as indicated by block 146, although as noted above with regard to skew adjuster 44 in FIG. 2, in other embodiments either or both clock signals can be adjusted or otherwise provided to have the indicated relative skew or offset between them. Operation in the above-described manner quickly drives error signal 98 to zero and results in improved correspondence between first and second digital output signals 36 and 38.

Figure 5:
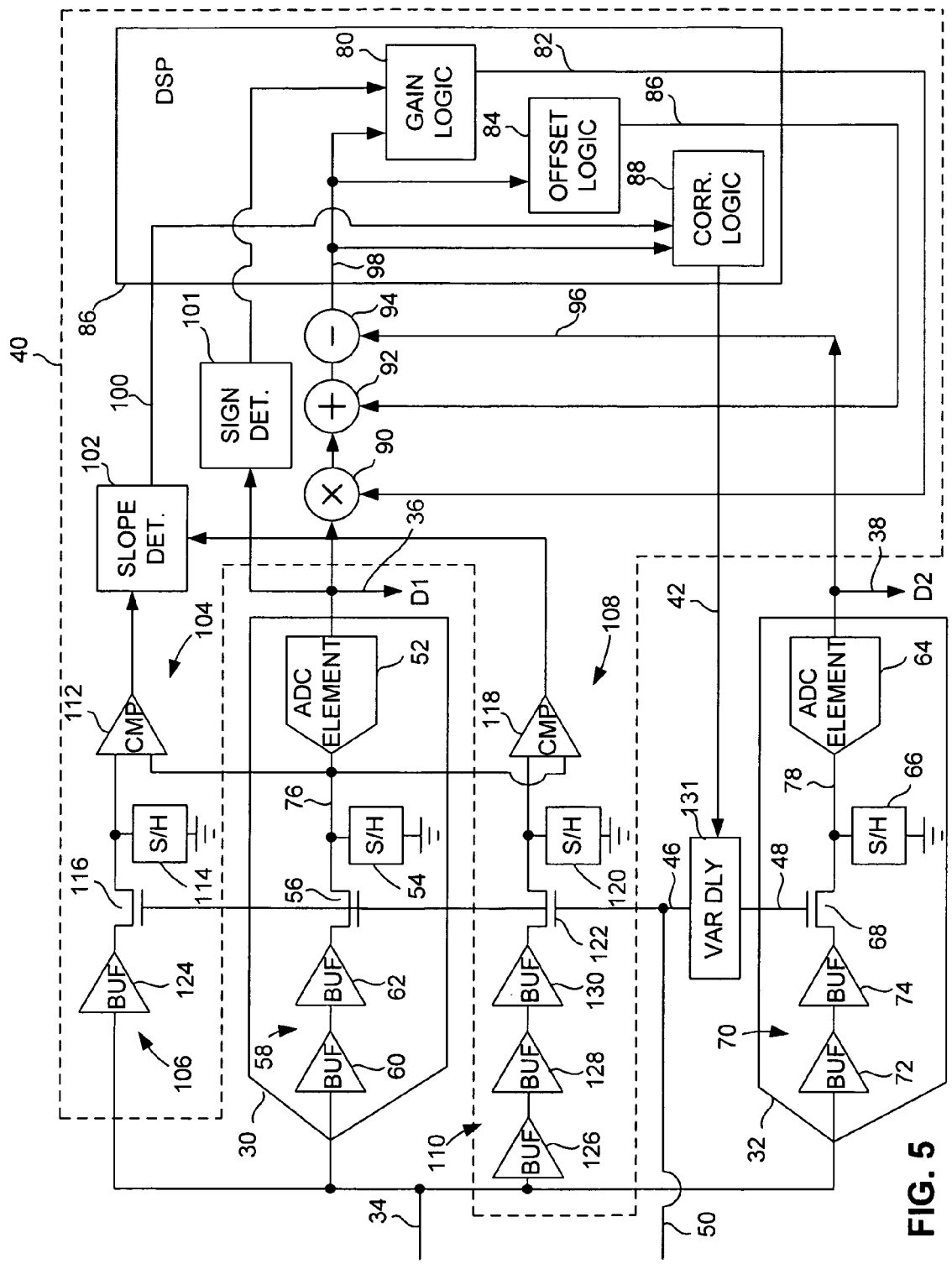
FIG. 5 is a block diagram of an alternative system.

Various alternative embodiments, such as that illustrated in FIG. 5, will occur readily to persons skilled in the art in view of the teachings herein. In the embodiment illustrated in FIG. 5, the skew estimator defined by the combination of multiplier 90 and adder 92 is coupled to the output of first ADC 30 instead of the output of second ADC 32 as in the embodiment illustrated in FIG. 4. Persons skilled in the art will recognize that such embodiments are functionally equivalent and that still others, involving various other arrangements of subtractor 94, multiplier 90 and adder 92, can be provided.

While various embodiments of the invention have been described, it will be apparent to those of ordinary skill in the art that still other embodiments are possible that are within the scope of this invention. Accordingly, the invention is not to be restricted except in light of the following claims.

What is claimed is:

1. An analog-to-digital converter (ADC) system, comprising:
   a first ADC comprising a first ADC element, the first ADC element producing a first digital output signal in response to a first analog signal representing an analog input signal to be converted and a first clock signal representing a master clock signal;
   a second ADC comprising a second ADC element, the second ADC element producing a second digital output signal in response to a second analog signal representing the analog input signal to be converted and a second clock signal representing the master clock signal;
   a correction estimator, the correction estimator comprising gain logic, offset logic, and a slope detector, the slope detector producing a slope factor representing a slope of the analog input signal, the gain logic producing a gain signal in response to the first digital output signal and the second digital output signal, the offset logic producing an offset signal in response to the first digital output signal and the second digital output signal, wherein the correction estimator applies the gain signal to at least one of the first digital output signal and the second digital output signal and applies the offset signal to at least one of the first digital output signal and the second digital output signal, and wherein the correction estimator produces a correction signal in response to the first digital output signal, the second digital output signal and the slope factor; and
   a timing adjuster, the timing adjuster adjusting a skew between the first clock signal and the second clock signal in response to the correction signal.

2. The ADC system claimed in claim 1, wherein the correction estimator comprises:
   a subtractor coupled to an output of one of the first ADC element and second ADC element;
   a multiplier coupled to an output of one of the first ADC element and second ADC element, the multiplier receiving the gain signal; and
   an adder coupled to an output of one of the first ADC element and second ADC element, the adder receiving the offset signal.

3. The ADC system claimed in claim 2, wherein:
   the multiplier and the adder together define a skew estimator, and an input of the skew estimator is coupled to an output of one of the first ADC element and second ADC element; and
   a first input of the subtractor is coupled to an output of the skew estimator, a second input of the subtractor is coupled to an output of an other one of the first ADC element and second ADC element.

4. The ADC system claimed in claim 3, wherein:
   the subtractor produces an error signal; and
   the correction estimator produces the correction signal, the offset signal, and the gain signal in response to the error signal.

5. The ADC system claimed in claim 1, wherein the slope detector comprises:
   a delay system, the delay system producing a plurality of samples of the analog input signal delayed by different amounts from each other; and
   a comparator system, the comparator system comparing the plurality of samples of the analog input signal with a sample of one of the first and second analog signals to determine whether the analog input signal is rising or falling.

6. The ADC system claimed in claim 1, wherein the correction estimator comprises a digital signal processor.

7. An analog-to-digital converter (ADC) system, comprising:
   a first ADC comprising a first ADC element, the first ADC element producing a first digital output signal in response to a first analog signal representing an analog input signal to be converted and a first clock signal representing a master clock signal;
   a second ADC comprising a second ADC element, the second ADC element producing a second digital output signal in response to a second analog signal representing the analog input signal to be converted and a second clock signal representing the master clock signal;
   a slope detector for producing a slope factor representing a slope of the input analog signal, the slope detector comprising a delay system and a comparator system, the delay system producing a plurality of samples of the analog input signal delayed by different amounts from each other, the comparator system comparing the plurality of samples of the analog input signal with the first analog signal;
   a correction estimator, the correction estimator comprising gain logic for producing a gain signal, offset logic for producing an offset signal, and correction logic for producing a correction signal, the correction estimator further comprising a subtractor, an adder and a multiplier, the subtractor producing an error signal in response to a skew estimate and an output of one of the first ADC and second ADC, the adder adding the offset signal to an output of the multiplier to produce the skew estimate, and the multiplier multiplying an output of an other one of the first ADC and second ADC by the gain signal, wherein the offset logic produces the offset signal in response to a previous offset signal value and previous error signal value and produces the gain signal in response to a previous gain signal value, a previous error signal value and a previous sampled value; and
   a timing adjuster, the timing adjuster adjusting a skew between the first clock signal and the second clock signal in response to the correction signal.

8. The ADC system claimed in claim 7, wherein:
   the first ADC comprises a first delay element, the first delay element delaying the signal to be converted by a predetermined amount to produce the first analog signal;
   the second ADC comprises a second delay element, the second delay element delaying the signal to be converted by a predetermined amount to produce the second analog signal;
   the comparator system comprises a third delay element, a fourth delay element, a first comparator, a second comparator, and slope detection logic, the first comparator receiving an output of the third delay element, the second comparator receiving an output of the fourth delay element, the third delay element delaying the signal to be converted by an amount less than the predetermined amount to produce a third analog signal, and the fourth delay element delaying the signal to be converted by an amount greater than the predetermined amount to produce a fourth analog signal, the first comparator comparing the third analog signal with the first analog signal to produce a first comparator output, the second comparator comparing the fourth analog signal with the first analog signal to produce a second comparator output, the slope detection logic producing the slope factor in response to the first comparator output and the second comparator output.

9. A method of operation of a system comprising a first analog-to-digital converter (ADC) having a first ADC element and a second ADC having a second ADC element, the method comprising:

the first ADC element producing a first digital output signal in response to a first analog signal representing an analog input signal to be converted and a first clock signal representing a master clock signal;

the second ADC element producing a second digital output signal in response to a second analog signal representing the analog input signal to be converted and a second clock signal representing the master clock signal;

producing a correction signal by producing a gain signal and an offset signal in response to the first digital output signal and the second digital output signal, producing a slope factor representing a slope of the analog input signal, applying the gain signal to at least one of the first digital output signal and the second digital output signal, and applying the offset signal to at least one of the first digital output signal and the second digital output signal, wherein the correction signal is produced in response to the first digital output signal, the second digital output signal and the slope factor; and adjusting a skew between the first clock signal and the second clock signal in response to the correction signal.

10. The method claimed in claim 9, wherein producing a correction signal comprises:

determining an error signal by determining a difference between a skew estimate and a signal received from an output of one of the first ADC element and second ADC element;

multiplying a signal received from an output of one of the first ADC element and second ADC element by a gain signal to produce a gain-multiplied signal; and adding an offset signal to the gain-multiplied signal;

wherein the correction signal is produced in response to the error signal.

11. The method claimed in claim 9, wherein producing a slope factor comprises:

producing a plurality of samples of the analog input signal delayed by different amounts from each other; and comparing the plurality of samples of the analog input signal with a sample of one of the first and second analog signals to determine whether the analog input signal is rising or falling.

\* \* \* \* \*

UNITED STATES PATENT AND TRADEMARK OFFICE
CERTIFICATE OF CORRECTION

| | |
|---|---|
| PATENT NO. | : 7,808,408 B2 |
| APPLICATION NO. | : 12/388627 |
| DATED | : October 5, 2010 |
| INVENTOR(S) | : Avanindra Madisetti |

It is certified that error appears in the above-identified patent and that said Letters Patent is hereby corrected as shown below:

On the title page of the patent, in Item (73) the Assignee section:

Replace "Moblus" with --Mobius--

Signed and Sealed this
Eighteenth Day of January, 2011

David J. Kappos
*Director of the United States Patent and Trademark Office*